United States Patent
Steiner et al.

(10) Patent No.: US 7,124,504 B2
(45) Date of Patent: Oct. 24, 2006

(54) METHOD AND DEVICE FOR CONNECTING CONDUCTORS

(75) Inventors: Ernst Steiner, Heuchelheim (DE); Dieter Stroh, Wettenberg (DE); Horst Dieterle, Niederweimar (DE)

(73) Assignee: Schunk Ultraschalltechnik GmbH, Wettenberg (DE)

( * ) Notice: Subject to any disclaimer, the term of this patent is extended or adjusted under 35 U.S.C. 154(b) by 340 days.

(21) Appl. No.: 10/450,527

(22) PCT Filed: Jan. 11, 2002

(86) PCT No.: PCT/EP02/00198

§ 371 (c)(1),
(2), (4) Date: Jun. 20, 2003

(87) PCT Pub. No.: WO02/061895

PCT Pub. Date: Aug. 8, 2002

(65) Prior Publication Data

US 2004/0038598 A1    Feb. 26, 2004

(30) Foreign Application Priority Data

Jan. 12, 2001    (DE) ................................ 101 01 236

(51) Int. Cl.
*H01R 43/20* (2006.01)
*H01R 43/00* (2006.01)
*H01R 43/02* (2006.01)
*H01R 9/00* (2006.01)
*B29C 65/08* (2006.01)
*B23K 1/06* (2006.01)
*B23K 20/10* (2006.01)

(52) U.S. Cl. ............................ 29/860; 29/868; 29/876; 29/843; 29/749; 29/755; 156/73.1; 156/580.1; 228/1.1; 228/110.1

(58) Field of Classification Search .................. 29/868, 29/860, 857, 876, 869, 843, 749, 755; 156/73.1, 156/290, 308.2, 308.4, 309.6, 580.1; 228/1.1, 228/110.1
See application file for complete search history.

(56) References Cited

U.S. PATENT DOCUMENTS

| 4,589,584 A |   | 5/1986  | Christiansen |         |
|-------------|---|---------|--------------|---------|
| 4,663,840 A | * | 5/1987  | Ubbens et al. ................ | 29/853 |
| 4,792,079 A | * | 12/1988 | Bansemir ..................... | 228/1.1 |
| 4,943,702 A | * | 7/1990  | Richardson ............ | 219/124.34 |
| 5,354,392 A | * | 10/1994 | Santo et al. ................ | 156/73.1 |

(Continued)

FOREIGN PATENT DOCUMENTS

EP          1014515       6/2000

(Continued)

OTHER PUBLICATIONS

Online definition for "sequential" (www.dictionary.cambridge.org).*

*Primary Examiner*—David P. Bryant
*Assistant Examiner*—Sarang Afzali
(74) *Attorney, Agent, or Firm*—Dennison, Schultz & MacDonald

(57) ABSTRACT

A method and device for making multiple connections between electrical conductors surrounded by external insulators in overlapping flexible cables by ultrasonic welding. Overlapping conductors to be connected are arranged on a surface of a carrier disposed between a sonotrode and an electrode, the sonotrode and electrode are sequentially aligned the with overlapping points to be welded, and the conductors are ultrasonically welded at each of the overlapping points. The carrier either includes the electrode at least in designated areas, or includes penetrations constructed and arranged to receive an electrode in designated areas.

25 Claims, 5 Drawing Sheets

U.S. PATENT DOCUMENTS 5,667,130 A * 9/1997 Morita et al. ............ 228/110.1
5,857,259 A * 1/1999 Johnston ...................... 29/858
5,971,251 A * 10/1999 Moore et al. ............ 228/112.1
6,089,438 A * 7/2000 Suzuki et al. ................ 228/1.1
6,213,377 B1 * 4/2001 Schwerdtle et al. ..... 228/110.1

FOREIGN PATENT DOCUMENTS

JP          2000294332 A  * 10/2000

* cited by examiner

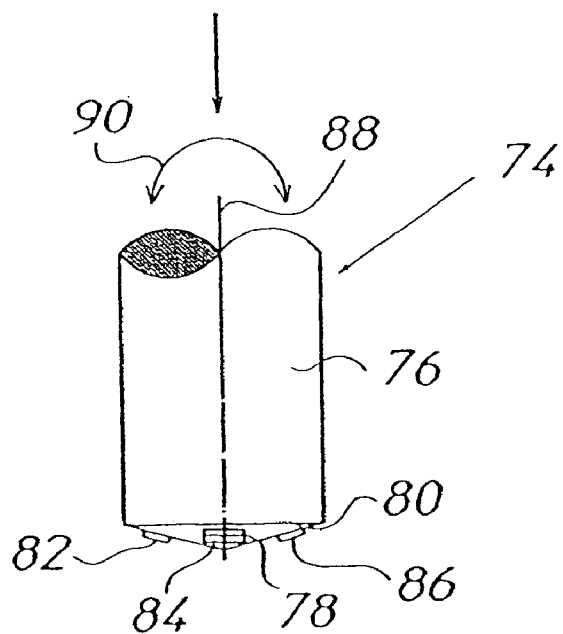
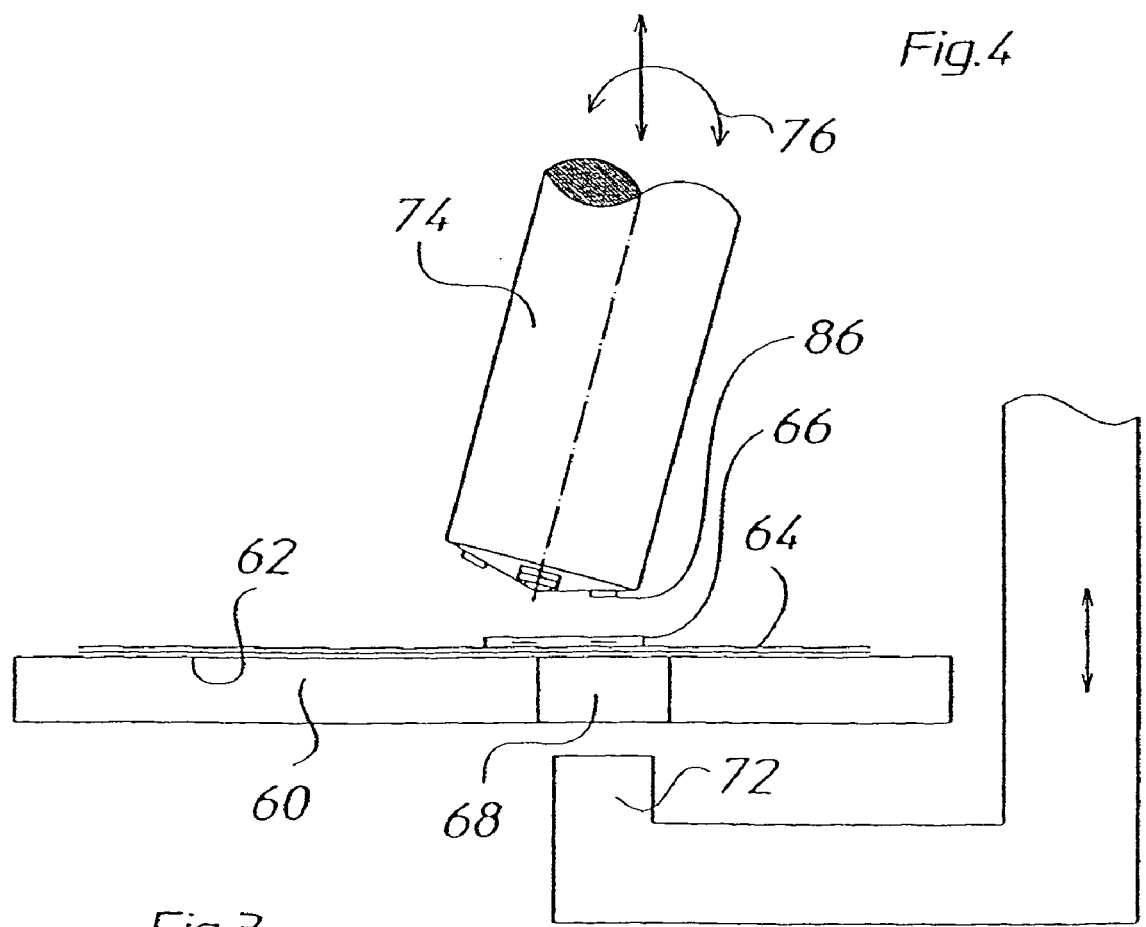
Fig. 4
Fig. 3

METHOD AND DEVICE FOR CONNECTING CONDUCTORS

This application is a filing under 35 USC 371 of PCT/EP02/00198, filed Jan. 11, 2002.

The invention relates to a method for connection such as welding of electrical conductors surrounded by external insulators in overlapping flexible cables by means of a sonotrode generating ultrasonic oscillations and an electrode associated therewith, where the conductors to be connected are arranged on a surface of a carrier running between sonotrode and electrode. Furthermore, the invention relates to a device for connection of electrical conductors surrounded by external insulators in overlapping flexible cables by means of a sonotrode generating ultrasonic oscillations and an electrode associated therewith, where the conductors to be welded are arranged on a surface of a carrier running between the sonotrode and the electrode.

In motor vehicles in particular, flexible cables (FPC=Flexible Printed Cable; FLV=Flexible Laminated Cable; FFC=Flexible Flat Cable) are increasingly being used for wiring of the vehicle electrical system. High flexibility, low space requirement and weight savings distinguish suitable flexible cables, also referred to as flat cables. If flexible cables are connected, it must be ensured that the contacts can withstand mechanical stresses, in order to guarantee the required current/signal power. It is frequently necessary here for electrical conductors of overlapping flexible cables to be connected in electrically conducting manner in cramped spaces. Since flexible cables are increasingly superseding cable harnesses, it must furthermore be possible to electrically link up a large number of flexible cables. To do so, these flexible cables must be aligned with one another in one plane.

It is known from EP 1 014 515 A1 and from EP 0 191 175 B1 how to connect flexible cables to one another by ultrasonic welding.

The problem underlying the present invention is to develop a method and a device of the type described at the outset such that electrical conductors of overlapping flexible cables can be connected with high precision even if a large number of flexible cables are aligned with one another in one plane.

The problem is solved in accordance with the invention substantially by a process where the flexible cables are welded one after the other in various areas, the sonotrode and the various areas are consecutively aligned with one another, and the carrier used is one that is designed at least in areas as an electrode or has in those areas in which the flexible cables are welded penetrations on which the electrode is aligned to the necessary extent or which are aligned to the necessary extent on the electrode. Here the sonotrode is moved in particular relative to the carrier. An adjustment of the carrier relative to the sonotrode or a mutual movement relative to one another is likewise possible.

Regardless of this, the sonotrode used should be one that is designed as a torsion oscillator, a longitudinal oscillator mounted as a rocker, a parallel-guided longitudinal oscillator or a flexible oscillator.

The invention is characterized in particular in that the sonotrode for generating the ultrasonic energy required for connection such as welding of the conductors is converted to torsion oscillation, where the longitudinal axis of the sonotrode is vertical or oblique to the surface of the carrier on which the flexible cables to be connected or welded are arranged.

In accordance with the invention, an ultrasonic welding device is used in particular with a torsion oscillator, a longitudinal oscillator mounted as a rocker, a parallel-guided longitudinal oscillator, a flexible oscillator or another sonotrode design known from ultrasonic welding devices in order to generate the necessary ultrasonic energy. The sonotrode or its welding surface can then be aligned on the conductors to be welded. The carrier itself can be used as the electrode, on which carrier the flexible cables are arranged precisely positioned in alignment with one another. It is however also possible to provide the carrier with penetrations to align an electrode on these to the required extent and to support the conductors to be connected when welding is to take place.

Furthermore, it is possible when a torsion oscillator is used as the sonotrode emitting the ultrasonic energy to connect the conductors both by purely mechanical connection and by welding. The former is made possible by the fact that the sonotrode head is designed tapering to a point on its end face, such that the conductors to be connected can be pierced by means of the tip, as a result of which they are deformed in the same direction and in particular mechanically connected to one another in positive form. In addition, welding of the conductors pierced in this way is possible by bonding the welding surfaces of the sonotrode with the conductors and supporting them on an electrode. To do so, the electrode can have in accordance with the geometry created by the piercing of the mechanically connected conductors a funnel-like depression, along whose limiting surfaces the pierced conductors extend.

To permit a precise welding of the conductors in specified areas, an embodiment of the invention provides that the sonotrode is aligned on the welded conductors under visual control with the aid of an optical system. This visual check can be performed with an image processing means. This permits automatic movement of the sonotrode to the area of the conductors in which the welding is to be performed.

It is however additionally and complementarily possible to identify the area to be welded optically, for example by means of a laser beam, in order to then advance the sonotrode automatically or manually.

The invention is also characterized in that not only welding of the conductors, i.e. of metal, takes place by means of the sonotrode, but also that the overlapping external insulators are connected to one another by plastic welding by means of ultrasonic sound. To do so, the sonotrode is designed such that metal welding is performed over one area and plastic welding over another area running vertically to the actual or apparent oscillation direction of the sonotrode.

A device of the type mentioned at the outset is characterized in particular in that the sonotrode is relatively movable along the surface of the carrier for welding of the conductors in various areas, and in that the carrier either has penetrations on which the electrode can be aligned or is designed at least in areas as the electrode. Here the sonotrode should be a torsion oscillator, a longitudinal oscillator mounted as a rocker, a parallel-guided longitudinal oscillator or a flexible oscillator.

It is provided in particular that the sonotrode is a torsion oscillator whose longitudinal axis is oblique or vertical to that surface of the carrier receiving the flexible cables. The sonotrode and the electrode can here be designed as welding tongs. In this case, the sonotrode and the electrode form a unit that is adjustable relative to the flexible cables.

It is however provided in particular that the sonotrode such as the torsion oscillator extends from a gantry movable parallel to the surface in two coordinate directions, to which gantry the sonotrode is height-adjustably and/or swivellably arranged. The sonotrode extends preferably from a cross-carrier adjustable along a gantry, along which and relative to which the sonotrode is adjustable.

Provided the carrier for the flexible cables is not the electrode, the electrode can be designed to move with the sonotrode, so that those areas of the flexible cables which are to be welded to one another can be moved to with high precision and in a short time.

According to a further proposal of the invention the sonotrode can be adjustable using a multiple-axis robot system or by a SCARA robot. Other possibilities for aligning the sonotrode on the electrical conductors to be connected or welded also exist.

To align the plane extent of the welding points selectively on the conductors to be welded and/or to achieve long service lives, an embodiment inventive per se provides that the sonotrode in the form of a torsion oscillator has a sonotrode head surface with at least two welding surfaces that can have differing extents. Here the required welding surface can be aligned on the conductors to be welded by rotation and/or tilting of the torsion oscillator about its longitudinal axis.

In particular, the sonotrode head surface has a tapering shape such as a cone, a truncated cone, a pyramid or a truncated pyramid. Various welding surfaces can then be provided distributed over the surface and at a distance from the longitudinal axis of the torsion oscillator, and can be aligned on the welding areas by rotating/tilting the sonotrode, i.e. the torsion oscillator.

A further noteworthy proposal of the invention provides that the sonotrode in the form of a torsion oscillator has a point running in its longitudinal direction for piercing the flexible cables to be connected. This permits a mechanical and in particular positive connection of the conductors. Complementarily, ultrasonic welding of the conductors can then take place. To do so, the electrode has a funnel-shaped recess within which the pierced conductors extend to permit their welding.

It is furthermore possible to design the sonotrode, i.e. its head, such that over one area metal welding, i.e. the connection of the conductors to one another, and over another area plastic welding, i.e. connecting the external insulators of the flexible cables, is permitted.

Positioning of the sonotrode on conductors to be welded is possible using optical checking means. To do so, an image processing means and/or an optical beam such as a laser beam can be used, which can be aligned on the welding area or welding point in order to facilitate automatic or manual movement of the sonotrode or its welding surface.

Together with welding, quality monitoring is possible at the same time, preferably path-dependent, for example with servo-drive, and dependent on energy, time or force. Multistage welding is also possible. To that extent, reference is made to suitable technologies.

Furthermore, it is possible without difficulty, for example depending on the materials to be connected, to weld using different frequencies.

Further details, advantages and features of the invention are shown not only in the claims and in the features they contain—singly and/or in combination—but also in the following description of preferred embodiments shown in the drawing.

Figure 5:
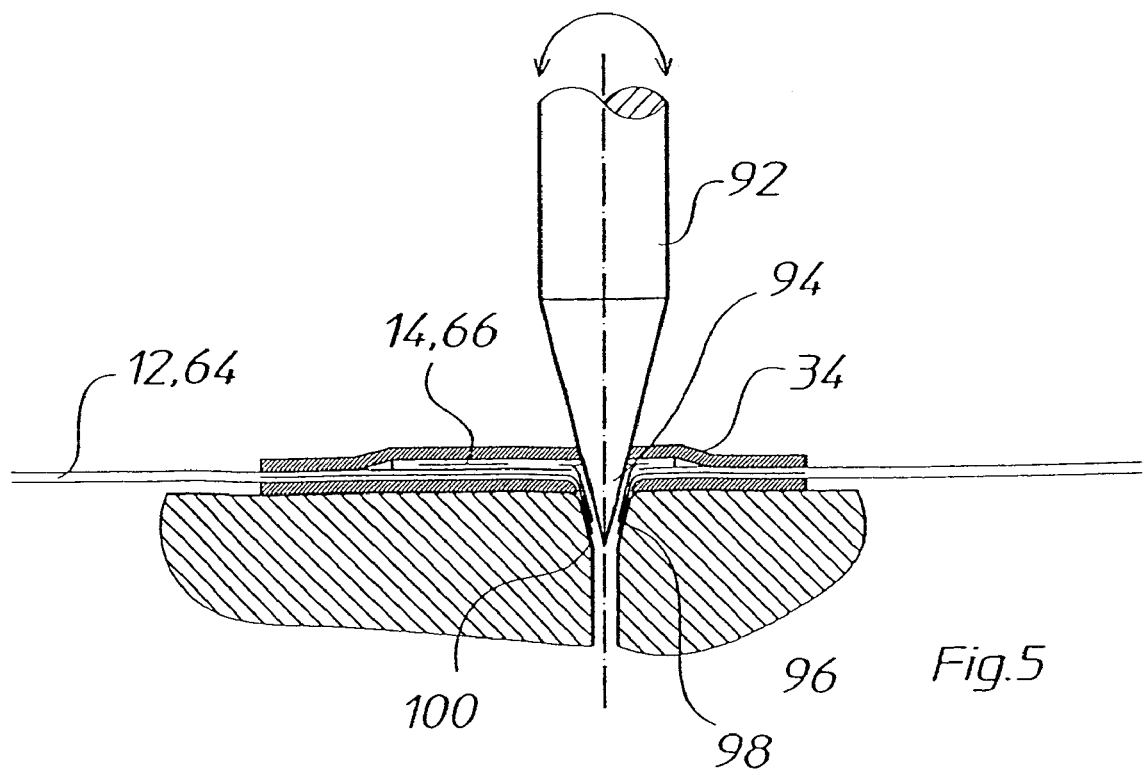
Figure 6:
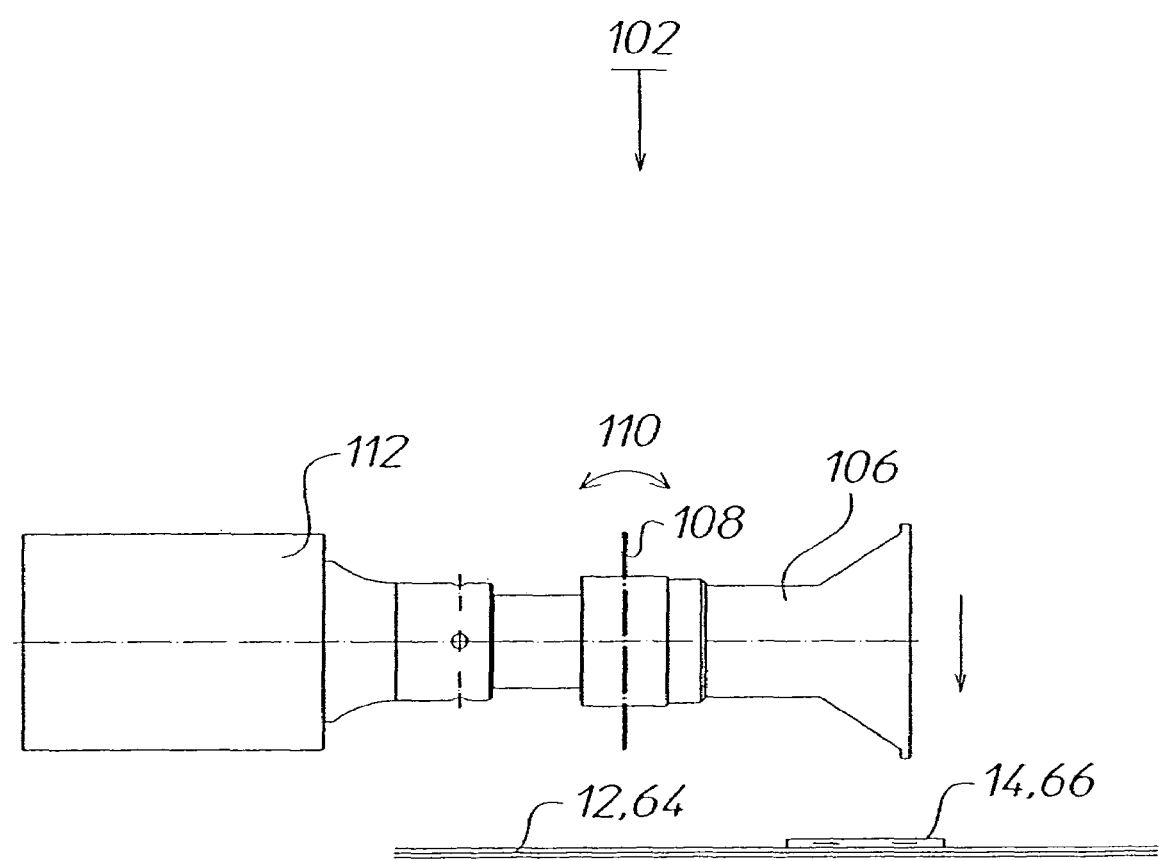
Figure 7:
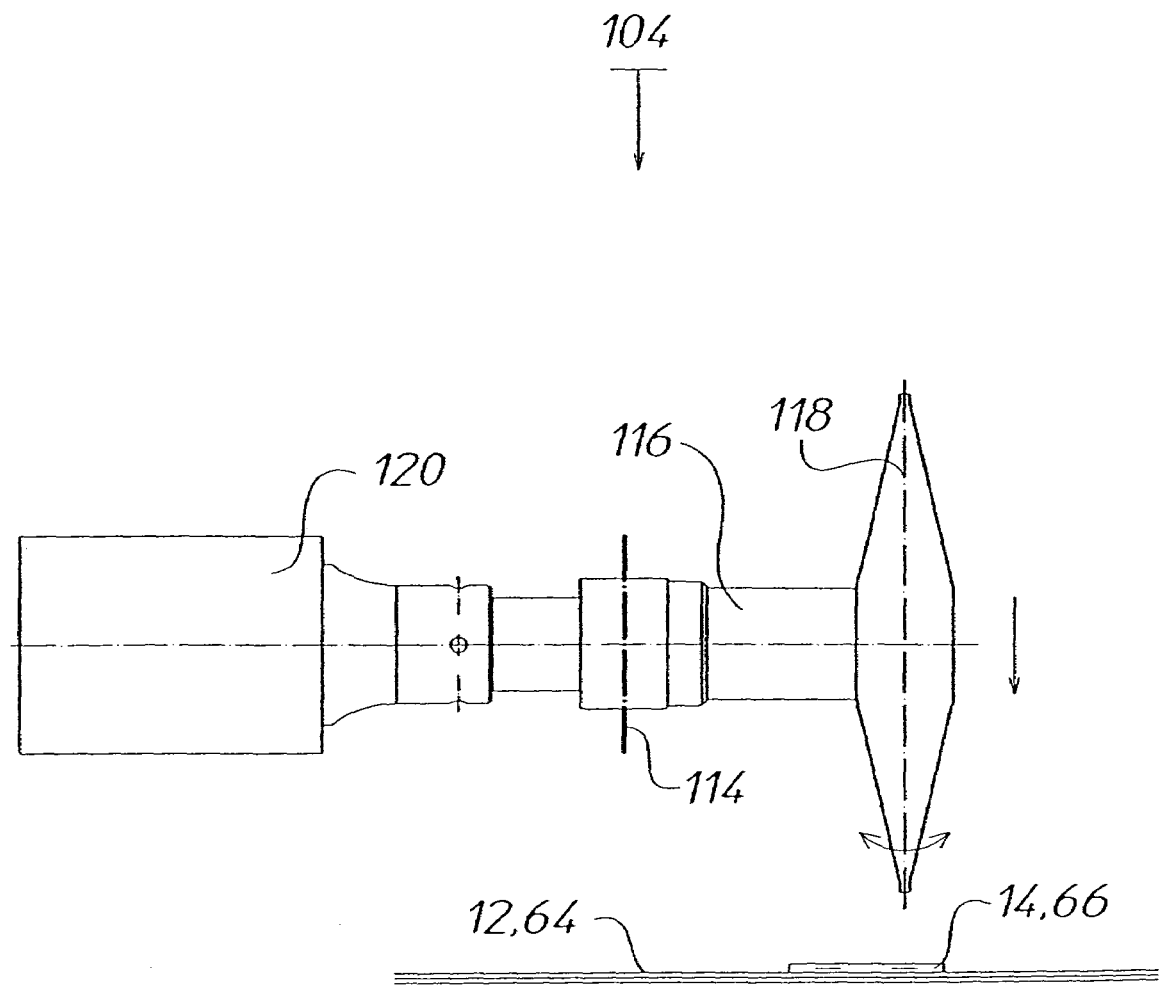

FIG. 3 shows a section of a further embodiment of a device for welding flexible cables, FIG. 4 shows a section of a sonotrode in the form of a torsion oscillator, FIG. 5 shows a principle view of a torsion oscillator with electrode connecting electrical conductors, FIG. 6 shows a principle view of a sonotrode designed as a longitudinal oscillator, and FIG. 7 shows a principle view of a sonotrode designed as a flexible oscillator.

Figure 1:
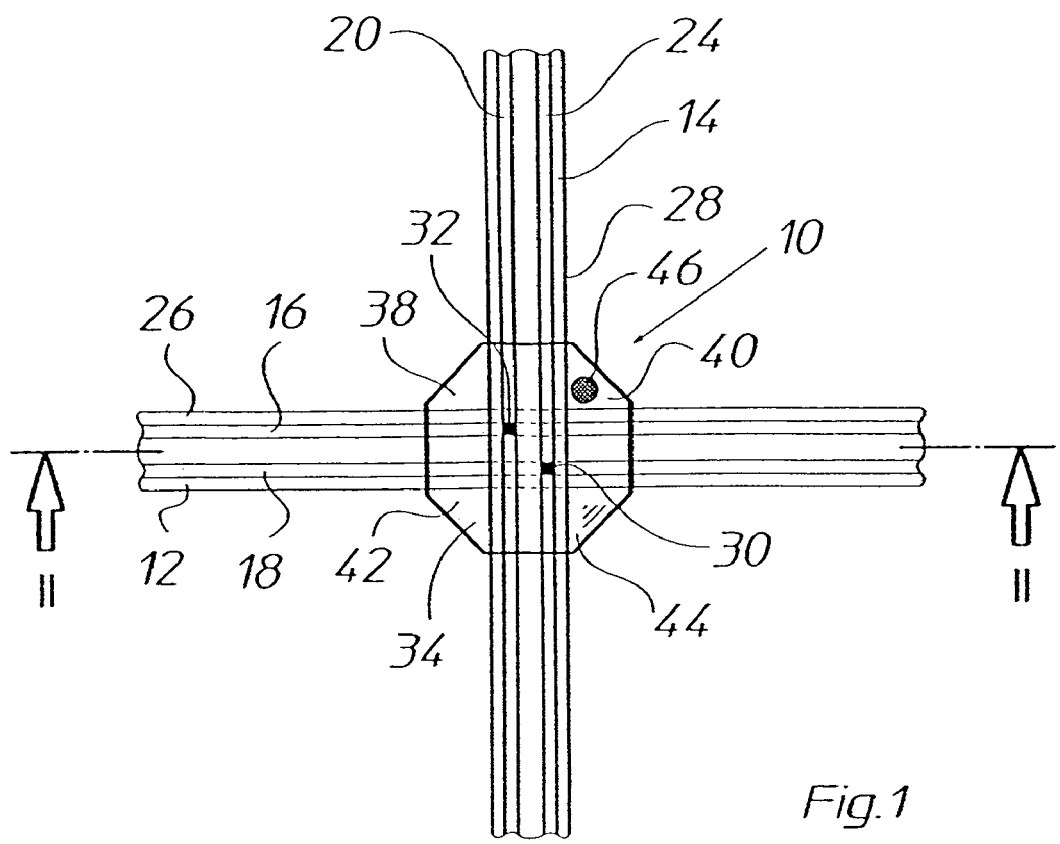
FIG. 1 shows a plan view of an overlapping area of flexible cables.

FIG. 1 shows in principle only an overlapping area 10 between flexible cables 12 and 14. The drawing illustrates that the flexible cables 12, 14 intersect at right angles without restricting the teachings in accordance with the invention as a result. Instead this applies for overlapping areas generally, i.e. areas where flexible cables lie on top of one another at least in sections and their conductors are connected in electrically conductive manner. FIG. 1 also does not show that for implementation of the teachings in accordance with the invention it is provided in particular that a plurality of flexible cables are aligned on one another spread over one plane, in order to then connect electrical conductors to the required extent, as shown in principle in FIG. 2.

FIG. 1 furthermore shows that the flexible cables 12, 14 have in known manner electrical conductors 16, 18 or 20, 24 such as flat copper conductors designed like PCBs. The conductors 16, 18, 20, 24 are then surrounded by a plane external insulator 26, 28. This can be achieved by embedding the conductors for example in polyester films.

If conductors of flexible cables are to be connected to one another, the conductors in the overlapping areas are preferably exposed and then bonded with one another. In the embodiment, the electrical conductors 18, 24 and 16, 20 are connected by welding at contact points 30, 32. To do so, the insulation 26, 28 is removed in the usual way, for example by laser, in order to then connect the exposed conductors to one another. In certain applications, however, bonding by means of ultrasonic welding is possible without prior removal of the insulation.

For the contacts to withstand even heavy mechanical stresses, the overlapping area 10 can be surrounded by covers that extend with sections 38, 40, 42, 44 even outside the conductors 12, 14 and are connected to one another by ultrasonic welding. This stabilizes the contact points 30, 32. At the same time, however, the flexibility of the flexible cables 12, 14 per se is not lost, since the plane covers consist of plastic material such as hot-melt adhesive or plastic tape with hot-melt adhesive and can have a thickness corresponding approximately to that of the flexible cable. Thanks to the low height of the covers, it is clear that the construction height of the flexible cables 12, 14 is generally speaking not disturbingly altered.

The covers have preferably a round form. The sections 38, 40, 42, 44 passing between the conductors 12, 14 can be straightened on the circumference side in accordance with the illustration in FIG. 1. Furthermore the sections, 38, 40, 42, 44 can, after fitting of the conductors 12, 14, be used as fasteners, for example in a motor vehicle. An appropriate fastening point is shown in FIG. 1 with the reference number 46.

In order to connect flexible cables 47, 49 to one another in electrically conductive manner, it is provided in accordance with the invention that the flexible cables 47, 49 are positioned on a surface 48 of a carrier 50 in order to be then connected in electrically conductive manner by means of ultrasonic welding. To do so, an appropriate sonotrode 52 must be aligned on the points to be connected. The sonotrode 52 can be a torsion oscillator connected to a converter, not shown in detail, in order to convert electrical oscillations into ultrasonic oscillations of a certain frequency and amplitude. The converter is here arranged in a housing 54 adjustable along a cross-piece 56 which is in turn movable along a gantry 58. This enables the sonotrode 52 to be moved over the entire surface 48, i.e. to go to any point required. As a result, the xy coordinates drawn in FIG. 2 can be covered. Furthermore, the housing 54 with the sonotrode 52 is also adjustable in the z direction, which in turn is swivellable about its longitudinal axis in order to use the required welding areas of the sonotrode head, as explained using FIGS. 3 and 4.

The electrode assigned to the sonotrode 52 can be the carrier 50 itself. Alternatively, as shown using FIG. 3, a carrier 60 on whose surface 62 flexible cables 64, 66 are positioned relative to one another can have penetrations 68. Here the areas of the flexible cables 64, 66 to be welded are aligned flush with the penetrations. Then the penetrations 68 can be passed through by an electrode 72 in order to support the flexible cables 64, 66. Opposite this in the embodiment a torsion oscillator 74 is set down on the connection area and set to rotary oscillation (arrow 76) in order to perform metal welding.

Figure 2:
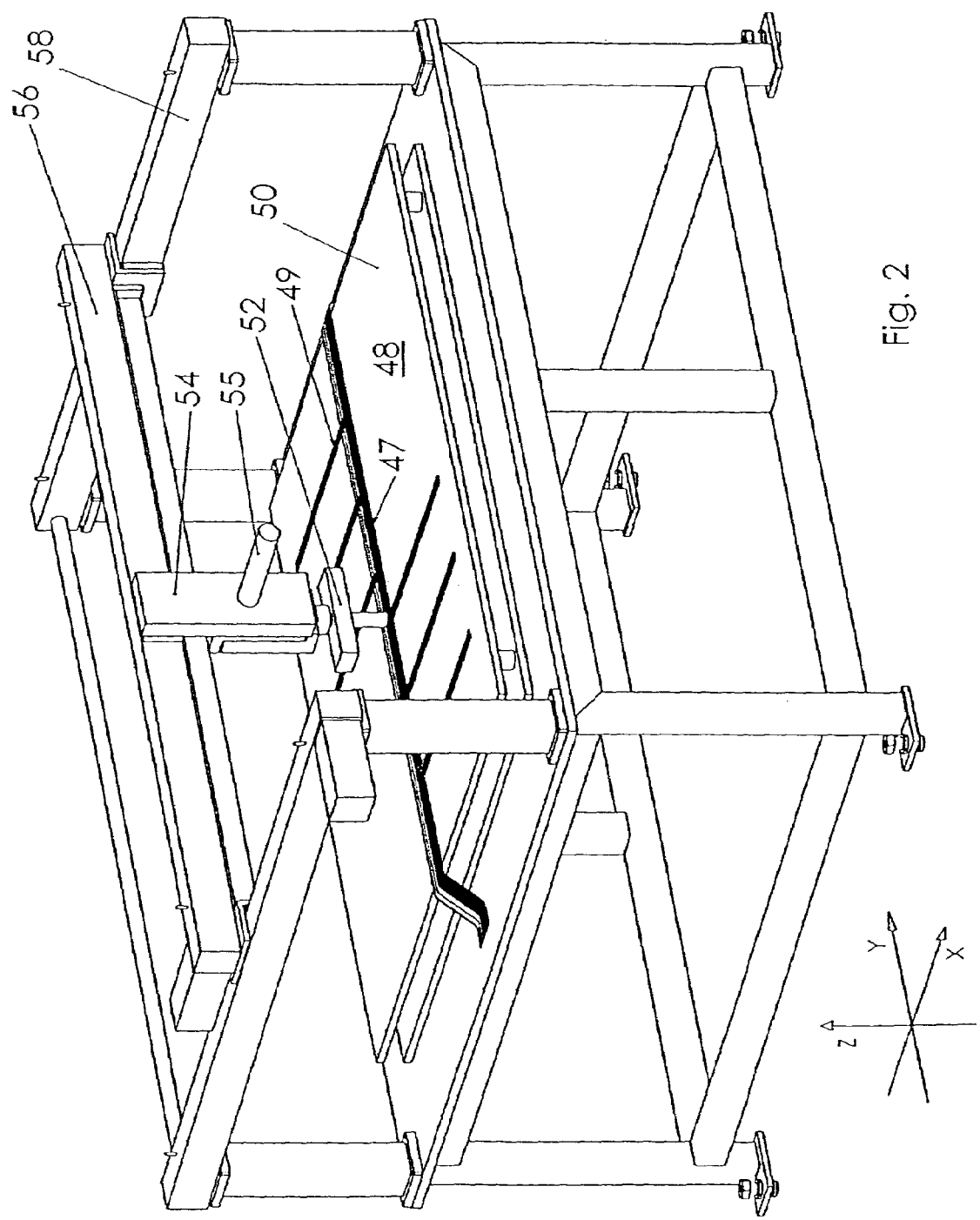
FIG. 2 shows a principle view of a device for welding of flexible cables.

As the sonotrode 52 as per FIG. 2 and a corresponding sonotrode 74 in FIG. 4 make clear, the sonotrode 74 has a cylindrical body 76 with a truncated cone-shaped head 78 on whose outer surface 80 several welding surfaces 82, 84, 86 of possibly divergent dimensions are provided which can be set down on those areas of the flexible cables 64, 66 to be welded, in order to then weld the electrical conductors of flexible cables 64, 66 while they are simultaneously supported on the electrode 72. In order to align a required welding surface 82, 84, 86 of the sonotrode head on a contact area, it is only necessary that the sonotrode 74 is rotated and/or swivelled about its longitudinal axis 74 (double arrow 90).

To align the sonotrode 74 or the welding surface 82, 84, 86 precisely on the welded area, an optical system such as an image processing means can be used. It is also possible to move the sonotrode manually, where the area to be welded can be identified for example optically by means of a laser beam, for example. To do so, a handle 55 extends from the housing 54 as per FIG. 2.

As regards the embodiment in FIG. 3, it must be noted that the sonotrode 74 and the electrode 72 can be designed as welding tongs, so that synchronous movement is achieved.

If in the case of a gantry construction as shown in principle in FIG. 2 the carrier 50 is not designed as the electrode, but instead has penetrations in accordance with FIG. 3 on which the contact points are aligned, an electrode or anvil can move underneath the surface 48 synchronously with the movement of sonotrode 52.

While FIGS. 1 to 4 explain the welding of the contact points of conductors in overlapping flexible cables 12, 14, 47, 49, 64, 66 by means of torsion oscillators 52, 74, the teachings in accordance with the invention can also be achieved with other sonotrodes known from ultrasonic welding technology, such as a longitudinal oscillator 102 (FIG. 6) or a flexible oscillator 104 (FIG. 7). Here both the longitudinal oscillator 102 and the flexible oscillator 104 are designed tiltable, preferably in the manner of a rocker, in order to be aligned precisely on a required welding point of overlapping conductors 12, 14, 64, 66. Here the longitudinal oscillator 102 is mounted in an oscillation node 108 to be tilted in accordance with the double arrow 110 and hence lowered onto the welding point. The sonotrode 106 in the embodiment is here connected to a converter 112 without booster.

It is of course also possible to advance the oscillators 102, 104 parallel to the welding point.

The flexible oscillator 104 is mounted like a rocker in an area 114 of a booster 116 that connects the sonotrode 118 of the flexible oscillator to a converter 120. In respect of the design and functioning of the longitudinal oscillator 102 and flexible oscillator 104, reference is made to adequately known technologies, so that this point does not need to be dealt with in detail.

Quality monitoring can take place during welding itself. This can be path-dependent, for example with a servo-drive, and/or dependent on energy, time or force. Multi-stage welding is also possible.

Alignment of the sonotrode can, in divergence from the explained embodiments, also be performed by a multi-axis robot system or a SCARA robot. Other technical implementations are also conceivable. The crucial factor is however that the sonotrode or its welding surface should be very precisely alignable on areas to be welded. At the same time, optimum accessibility to the welding point should be assured. This is achieved in particular by the design of a torsion oscillator in accordance with the embodiments in FIGS. 3 and 4.

A further embodiment of the teachings in accordance with the invention is shown in FIG. 5, where not only welding of electrical conductors to be connected in flexible cables is achieved by means of a torsion oscillator 92, but also a mechanical connection of such conductors by piercing of the conductors themselves. To that end, the sonotrode 92 has at its end face a point 94 dimensioned such that conductors to be connected can be pierced at certain points. The result is a crater-like formation of the conductors to be connected caused by the form of the point 94. Here the forcing apart of the conductors is limited by an electrode 96 associated with the sonotrode 92 and having a trumpet-like or funnel-like recess 98 into which in some areas the point 94 of the sonotrode 92 extends when the conductors are pierced. The point 94 and the recess 98 are accordingly geometrically matched to one another. The conductors here hug the limiting surface 100 of the recess 98 so as to permit subsequent welding of the conductors with the ultrasonic energy generated by the sonotrode 92. The limiting surface 100 of the recess 98 of the electrode 96 therefore exercises the function of the anvil. Accordingly, the conductors are pierced in accordance with the embodiment in FIG. 5 and welded ultrasonically.

The invention claimed is:

1. A method for making multiple connections between electrical conductors surrounded by external insulators in overlapping flexible cables by ultrasonic welding, comprising the steps of:

arranging a plurality of said flexible cables overlapping at a plurality of points at which conductors are to be welded on a surface of a carrier disposed between a sonotrode and an electrode, performing relative movement between the sonotrode and carrier so as to sequentially align the sonotrode and electrode with each of the overlapping points to be welded, and ultrasonically welding the conductors at each of the overlapping points to be welded, wherein the carrier either comprises the electrode at least in designated areas, or comprises penetrations constructed and arranged to receive an electrode in designated areas.

2. Method according to claim 1, wherein the sonotrode is aligned on the conductors to be welded under visual control with the aid of an optical system.

3. Method according to claim 2, wherein the visual control is performed with an image processing means.

4. Method according to claim 1, wherein the performing relative movement comprises moving the sonotrode.

5. Method according to claim 1, wherein the sonotrode used is a torsion oscillator, a longitudinal oscillator mounted as a rocker, a parallel-guided longitudinal oscillator or a flexible oscillator.

6. Method according to claim 1, wherein the sonotrode is converted to torsion oscillation, where the longitudinal axis of the sonotrode is vertical or oblique to the surface on which the flexible cables to be welded are arranged.

7. Method according to claim 1, wherein the conductors are both mechanically pierced and welded by a torsion oscillation sonotrode.

8. Method according to claim 1, wherein the overlapping points to be welded are visually identified.

9. Method according to claim 1, wherein the performing relative movement comprises moving the carrier.

10. Device for connection of electrical conductors surrounded by external insulators in overlapping flexible cables by ultrasonic welding, comprising:
- a carrier having a surface on which a plurality of flexible cables having conductors are arranged in overlapping manner at a plurality of points at which the conductors are to be welded,
- a sonotrode for generating ultrasonic oscillations for welding of the conductors relatively movable along the surface of the carrier,
- an electrode associated with the sonotrode, positioned such that an area to be welded is disposed between the sonotrode and the electrode, and
- means for moving at least one of the sonotrode and carrier in order to sequentially align each of the points to be welded with the sonotrode and electrode,
- wherein the carrier either has penetrations constructed and arranged to receive an electrode, or comprises the electrode, at least in defined areas.

11. Device according to claim 10, wherein the sonotrode is a torsion oscillator having a sonotrode head surface with at least two welding surfaces.

12. Device according to claim 11, wherein the means for moving comprises means for rotation and/or tilting of the torsion oscillator.

13. Device according to claim 11, wherein the sonotrode has a head surface in a tapering shape selected from the group consisting of a cone, a truncated cone, a pyramid and a truncated pyramid.

14. Device according to claim 10, wherein the sonotrode is a torsion oscillator, a longitudinal oscillator mounted as a rocker, a parallel-guided longitudinal oscillator or a flexible oscillator.

15. Device according to claim 14, wherein the sonotrode is a torsion oscillator with a longitudinal axis oblique or vertical to the surface of the carrier.

16. Device according to claim 10, wherein the means for moving comprises means for aligning the sonotrode with conductors to be welded using optical checking means.

17. Device according to claim 16, wherein the area of conductors to be welded is indicated by an optical beam.

18. Device according to claim 10, wherein the sonotrode and the electrode are designed as welding tongs.

19. Device according to claim 10, wherein the sonotrode extends from a gantry movable parallel to the surface in two coordinate directions, to which gantry the sonotrode is height-adjustably and/or swivellably arranged.

20. Device according to claim 10, wherein the sonotrode extends from a cross-carrier adjustable along a gantry, along which and relative to which the sonotrode is adjustable or swivellable.

21. Device according to claim 10, wherein the electrode is adjustable synchronously with the sonotrode.

22. Device according to claim 10, wherein the means for moving comprises a multiple-axis robot system or a SCARA robot for adjusting the sonotrode.

23. Device according to claim 10, wherein the sonotrode is designed both for metal welding and for plastic welding.

24. Device according to claim 10, wherein the sonotrode is a torsion oscillator having a point running in its longitudinal direction for piercing the flexible cables to be connected.

25. Device according to claim 10, wherein the means for moving comprises means for moving the carrier.

* * * * *